United States Patent
Yang

(10) Patent No.: US 10,707,244 B2
(45) Date of Patent: Jul. 7, 2020

(54) ARRAY SUBSTRATE AND LIQUID CRYSTAL DISPLAY PANEL

(71) Applicant: WUHAN CHINA STAR OPTOELECTRONICS TECHNOLOGY CO., LTD., Wuhan (CN)

(72) Inventor: Zuyou Yang, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/210,920

(22) Filed: Dec. 5, 2018

(65) Prior Publication Data

US 2019/0305013 A1 Oct. 3, 2019

(30) Foreign Application Priority Data

Mar. 29, 2018 (CN) .......................... 2018 1 0270632

(51) Int. Cl.
*G02F 1/1362* (2006.01)
*H01L 27/12* (2006.01)

(52) U.S. Cl.
CPC .... *H01L 27/1244* (2013.01); *G02F 1/136286* (2013.01)

(58) Field of Classification Search
CPC ......... G02F 1/136286; G02F 1/134309; G02F 1/136227
See application file for complete search history.

(56) References Cited

U.S. PATENT DOCUMENTS

2018/0373369 A1\* 12/2018 Xu ........................... G06F 3/044

\* cited by examiner

*Primary Examiner* — Thomas L Dickey
(74) *Attorney, Agent, or Firm* — Kirton McConkie; Evan R. Witt

(57) ABSTRACT

The present disclosure provides an array substrate and a liquid crystal display panel. The array substrate, including a display area and a non-display area, comprises: a substrate; a patterned first metal layer disposed on the substrate, wherein the first metal layer in the non-display area includes at least two first metal lines; an insulating layer disposed on the first metal layer; and a patterned second metal layer disposed on the insulating layer, wherein the second metal layer in the non-display area includes at least two second metal lines; wherein the first metal lines and the second metal lines surround the display area and connect to each other through a through-hole in the insulating layer, and at least one of the first metal lines or the second metal lines electrically connects to a ground line of the array substrate.

9 Claims, 1 Drawing Sheet

ARRAY SUBSTRATE AND LIQUID CRYSTAL DISPLAY PANEL

FIELD OF INVENTION

The present disclosure relates to the field of liquid crystal display, and more particularly to an array substrate and a liquid crystal display panel.

BACKGROUND

Conventional low-temperature polysilicon (LTPS) and a-Si thin-film transistor (TFT) panels do not include an electrostatic discharge (ESD) protection structure. This makes charges accumulated in display area to cause interference to a display panel, decreasing display quality.

Therefore, there is a need to solve the problems existing in the prior art.

SUMMARY OF DISCLOSURE

The present disclosure provides an array substrate and a liquid crystal display panel, which generates advantageous effect of avoiding electrostatic charge interference.

The present disclosure provides an array substrate, including a display area and a non-display area, comprising:
a substrate;
a patterned first metal layer disposed on the substrate, wherein the first metal layer in the non-display area includes at least two first metal lines;
an insulating layer disposed on the first metal layer; and
a patterned second metal layer disposed on the insulating layer, wherein the second metal layer in the non-display area includes at least two second metal lines;
wherein the first metal lines and the second metal lines surround the display area and connect to each other through a through-hole in the insulating layer, and at least one of the first metal lines or the second metal lines electrically connects to a ground line of the array substrate.

According to the array substrate of the present disclosure, the at least two first metal lines are parallel to each other, and the at least two second metal lines are parallel to each other.

According to the array substrate of the present disclosure, a top-view projection of the first metal lines on the substrate and a top-view projection of the second metal lines on the substrate are perpendicular to each other.

According to the array substrate of the present disclosure, the first metal layer in the display area includes a plurality of third metal lines, and the second metal layer in the display area includes a plurality of fourth metal lines, and wherein the third metal lines and the fourth metal lines are data lines and scan lines, respectively.

According to the array substrate of the present disclosure, the third metal lines and the first metal lines are parallel to each other.

According to the array substrate of the present disclosure, the fourth metal lines and the second metal lines are parallel to each other.

According to the array substrate of the present disclosure, a central axis of the through-hole is perpendicular to the first metal lines and the second metal lines.

According to the array substrate of the present disclosure, the through-hole is filled with a metal.

According to the array substrate of the present disclosure, the ground line is a metal layer disposed on a surface of the substrate distant from the insulating layer.

The present disclosure provides an array substrate and a liquid crystal display panel. A patterned first metal layer is disposed on the substrate. The first metal layer in the non-display area includes at least two first metal lines. An insulating layer is disposed on the first metal layer. A patterned second metal layer is disposed on the insulating layer. The second metal layer in the non-display area includes at least two second metal lines. The first metal lines and the second metal lines surround the display area and connect to each other through a through-hole in the insulating layer, and at least one of the first metal lines or the second metal lines electrically connects to a ground line of the array substrate. Therefore, charges accumulated in the display area can be eliminated, raising display quality.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
FIG. 1 is a schematic diagram showing a cross-sectional view of an array substrate according to one embodiment of the present disclosure.

Reference will be made in detail to embodiments of the present invention. The same or similar elements and the elements having same or similar functions are denoted by like reference numerals throughout the descriptions. The embodiments described herein with reference to drawings are explanatory, illustrative, and used to generally understand the present invention. The embodiments shall not be construed to limit the present invention.

In the specification, it is to be understood that the terms such as "central," "longitudinal," "lateral," "length," "width," "thickness," "upper," "lower," "front," "rear," "left," "right," "vertical," "horizontal," "top," "bottom," "inner," "outer," "clockwise," and "counterclockwise" should be construed to refer to the orientation as described or as shown in the drawings under discussion. These relative terms are for convenience of description and do not require that the present disclosure be constructed or operated in a particular orientation. In addition, the terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, the terms "mounted," "connected," "coupled," "fixed," and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

The following disclosure provides many different embodiments or examples to achieve different structures of the present invention. In order to simplify the disclosure of the present invention, the components and settings of a set of specific examples will be described herein. Certainly, they are only examples, and are not to limit the present invention. In addition, the present disclosure may repeat the reference numerals and/or letters in different examples. This repetition is only for simplification and clarity purposes, not indicating any relationship between various embodiments and/or settings discussed. In addition, the present disclosure provides various examples of specific processes and materials, but any person skilled in the art may appreciate the application and applicability of other processes and/or materials.

Figure 2:
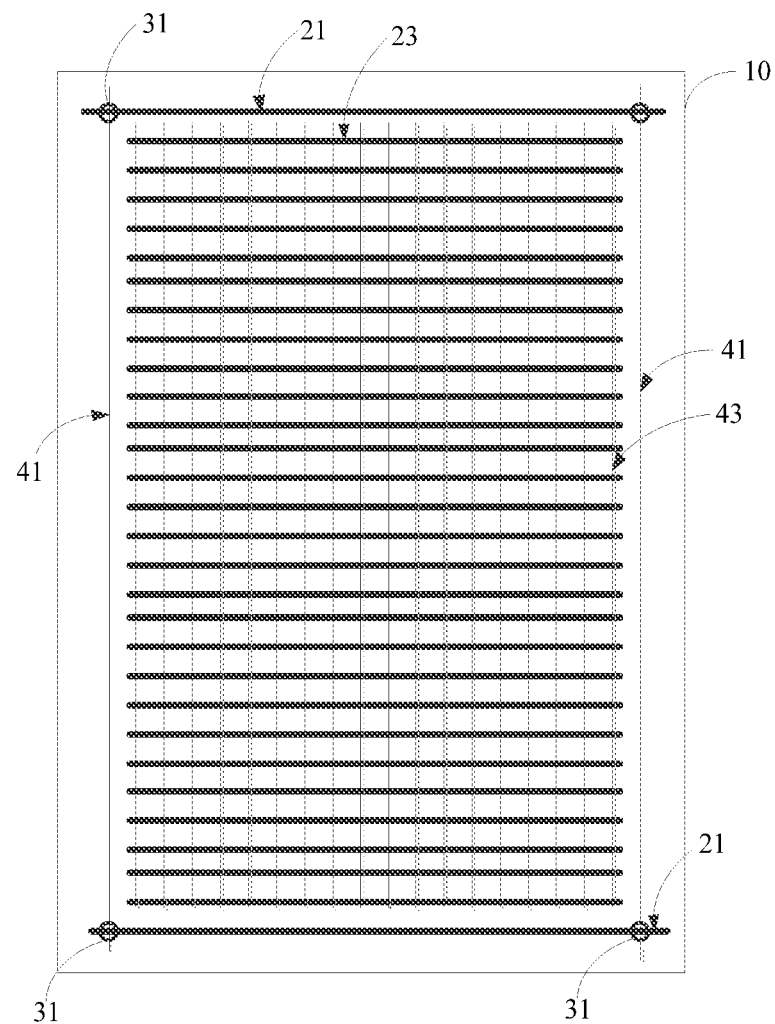
FIG. 2 is a schematic diagram showing a top view of an array substrate according to one embodiment of the present disclosure.

Please refer to FIGS. 1 and 2, in which FIG. 1 is a schematic diagram showing a cross-sectional view of an array substrate according to one embodiment of the present disclosure. The array substrate, viewed along horizontal direction, includes a display area and a non-display area. In addition, the array substrate, viewed along vertical direction, includes a substrate 10, a first metal layer 20, an insulating layer 30, and a second metal layer 40.

The first metal layer 20 is a patterned metal layer. The first metal layer 20 in the non-display area includes at least two first metal lines 21. The first metal layer in the display area includes a plurality of third metal lines 23. The third metal lines 23 and the first metal lines 21 are parallel to each other.

The insulating layer 30 is made of silicon nitride or silicon dioxide and is formed by deposition. The insulating layer 30 is disposed on the first metal layer 20.

The second metal layer 40 is disposed on the insulating layer 30, and is a patterned metal layer. The second metal layer in the non-display area includes at least two second metal lines 41. The second metal layer 40 in the display includes at least two fourth metal lines 43. The fourth metal lines 43 and the second metal lines 41 are parallel to each other.

The third metal lines 23 and the fourth metal lines 43 are data lines and scan lines. In one embodiment, the third metal lines 23 are data lines, and the fourth metal lines 43 are scan lines. In another embodiment, the third metal lines 23 are scan lines, and the fourth metal lines 43 are data lines.

The first metal lines 21 and the second metal lines 22 surround the display area and connect to each other through a through-hole 31 in the insulating layer 30. At least one of the first metal lines 21 or the second metal lines 41 electrically connects to a ground line of the array substrate 10.

The substrate 10 is a glass substrate or a substrate made of other materials. The substrate 10 includes a ground line.

The at least two first metal lines 21 are parallel to each other, and the at least two first metal lines 21 are disposed in the non-display areas at two opposite sides of the display area. Preferably, each of the two opposite sides of the display area includes a first metal line 21. The at least two second metal lines 41 are parallel to each other, and the at least two second metal lines 41 are disposed in the non-display areas at the other two opposite sides of the display area. Preferably, each of the other two opposite sides of the display area includes a second metal line 41.

A top-view projection of the first metal lines 21 on the substrate 10 and a top-view projection of the second metal lines 41 on the substrate 10 are perpendicular to each other.

A central axis of the through-hole 31 is perpendicular to the first metal lines 21 and the second metal lines 41. The top-view projection of the first metal lines 21 on the substrate 10 intersects with the top-view projection of the second metal lines 41 on the substrate 10 at the central axis of the through-hole 31. The through-hole 31 is filled with a metal.

The ground line is a metal layer disposed on a surface of the substrate distant from the insulating layer.

The present disclosure further provides a liquid crystal display panel, comprising a color filter substrate, a liquid crystal layer, and an array substrate as described in any one of the above embodiments. The liquid crystal layer is sandwiched between the color filter substrate and the array substrate.

The present disclosure provides an array substrate and a liquid crystal display panel, where the data lines and the scans lines are connected to each other to constitute a circuit, and the circuit is connected to a ground line, therefore charges accumulated in the display area can be eliminated, raising display quality.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An array substrate including a display area and a non-display area, comprising:
    a substrate;
    a patterned first metal layer disposed on the substrate, wherein the first metal layer in the non-display area includes at least two first metal lines;
    an insulating layer disposed on the first metal layer; and
    a patterned second metal layer disposed on the insulating layer, wherein the second metal layer in the non-display area includes at least two second metal lines;
    wherein the first metal lines and the second metal lines surround the display area and connect to each other through a through-hole in the insulating layer, at least one of the first metal lines or the second metal lines electrically connects to a ground line of the array substrate, and the ground line is a metal layer disposed on a surface of the substrate distant from the insulating layer.

2. The array substrate according to claim 1, wherein the at least two first metal lines are parallel to each other, and the at least two second metal lines are parallel to each other.

3. The array substrate according to claim 1, wherein a top-view projection of the first metal lines on the substrate and a top-view projection of the second metal lines on the substrate are perpendicular to each other.

4. The array substrate according to claim 1, wherein the first metal layer in the display area includes a plurality of third metal lines, and the second metal layer in the display area includes a plurality of fourth metal lines, and wherein the third metal lines and the fourth metal lines are data lines and scan lines, respectively.

5. The array substrate according to claim 4, wherein the third metal lines and the first metal lines are parallel to each other.

6. The array substrate according to claim 4, wherein the fourth metal lines and the second metal lines are parallel to each other.

7. The array substrate according to claim 1, wherein a central axis of the through-hole is perpendicular to the first metal lines and the second metal lines.

8. The array substrate according to claim 1, wherein the through-hole is filled with a metal.

9. A liquid crystal display panel, comprising the array substrate according to claim 1.

* * * * *